(12) United States Patent
Nazarian et al.

(10) Patent No.: US 7,995,385 B2
(45) Date of Patent: Aug. 9, 2011

(54) MEMORY ARRAY OF PAIRS OF NONVOLATILE MEMORY CELLS USING FOWLER-NORDHEIM PROGRAMMING AND ERASING

(75) Inventors: Hagop Nazarian, San Jose, CA (US); Michael Achter, Mountain View, CA (US); Harry Kuo, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 479 days.

(21) Appl. No.: 11/929,761

(22) Filed: Oct. 30, 2007

(65) Prior Publication Data

US 2009/0109758 A1    Apr. 30, 2009

(51) Int. Cl.
*G11C 16/06* (2006.01)

(52) U.S. Cl. ......... 365/185.02; 365/185.05; 365/185.28; 365/185.29

(58) Field of Classification Search ............. 365/185.03, 365/185.17, 185.05, 185.28, 185.02, 185.29
See application file for complete search history.

(56) References Cited

U.S. PATENT DOCUMENTS

| | | | | | |
|---|---|---|---|---|---|
| 5,029,131 | A | * | 7/1991 | Vancu | 365/185.03 |
| 5,111,430 | A | * | 5/1992 | Morie | 365/185.24 |
| 5,999,445 | A | * | 12/1999 | Rolandi et al. | 365/185.03 |
| 6,081,449 | A | * | 6/2000 | Sekariapuram et al. | 365/185.05 |
| 7,567,457 | B2 | * | 7/2009 | Nazarian et al. | 365/185.05 |

* cited by examiner

*Primary Examiner* — Andrew Q Tran
(74) *Attorney, Agent, or Firm* — Turocy & Watson, LLP

(57) ABSTRACT

A system comprising a program component that programs one or more non-volatile memory ("NVM") cells of an array of pairs of NVM cells using FN tunneling, an erase component that erases the one or more NVM cells of the array of pairs of NVM cells using FN tunneling, and a read component that reads the one or more NVM cells of the array of pairs of NVM cells.

20 Claims, 13 Drawing Sheets

PROGRAMMING MEMORY CELL OF A TWO DIMENSIONAL ARRAY

ERASING MEMORY CELLS OF A TWO DIMENSIONAL ARRAY

READING MEMORY CELL OF A TWO DIMENSIONAL ARRAY

US 7,995,385 B2

MEMORY ARRAY OF PAIRS OF NONVOLATILE MEMORY CELLS USING FOWLER-NORDHEIM PROGRAMMING AND ERASING

TECHNICAL FIELD

This disclosure relates generally to memory devices and in particular, but not exclusively, relates to a nonvolatile memory array partitioning architecture and method to utilize single level cells and multilevel cells within said architecture.

BACKGROUND

A wide variety of memory devices can be used to maintain and store data and instructions for various computers and similar systems. Non-volatile memory ("NVM") devices, e.g., EPROM, EEPROM, and flash memory, do not require power to retain information that is stored in them.

Conventional flash memories are constructed using either NAND or NOR architectures. The memory cells that make up these architectures can be formed into two-dimensional arrays, and typically include a metal oxide semiconductor transistor having a source, a drain, a channel in a substrate or P-well, a floating gate, and a control gate. Further, each memory cell is addressed by a respective bit line and word line. In conventional NOR flash architectures, the control gate of each memory cell is connected to a word line associated with a row of memory cells. In addition, the drain of each memory cell is connected to a bit line associated with a column of memory cells, and the source of each memory cell is connected to a common source node.

In conventional NAND flash architectures, although the control gate of each memory cell is connected to a word line associated with a row of memory cells, each memory cell associated with a bit line is connected in series with other memory cells associated with that bit line; one end of the bit line is connected to one of the memory cells of the series of memory cells, and the another memory cell of the series of memory cells is connected to a source line. Therefore, NAND flash memory cell read access time is slower than NOR flash memory cell read access time because unlike NOR flash memory cells, the drain of each of the NAND flash memory cells does not connect to a common bit line: NAND flash memory read parasitics are higher because of increased resistance in the read path of each bit, due to the series connection of memory cells associated with a particular word line.

Conventional NOR flash architectures are programmed and erased with techniques called "hot electron injection" and "hot hole injection." Hot electron and hot hole injection require applying high current and an associated electric field across the control gate and source or drain region of memory cells. Therefore, typical NOR flash architectures require circuits that provide large program and erase currents, which limits the program and erase time of the memory cells of NOR flash architectures.

In conventional NAND flash architectures, memory cells are programmed and erased with a technique called "Fowler-Nordhiem tunneling" ("FN tunneling"). Unlike hot electron and hot hole injection, FN tunneling merely requires applying an electric field between the control gate and source or drain region of the memory cells. Thus, FN tunneling is a faster programming method than hot electron and hot hole injection because it does not require large current to program and/or erase memory cells.

It is therefore desirable to have a non-volatile memory architecture that achieves the benefits of both conventional NAND and NOR architectures, i.e., fast read access times and fast program and erase times.

SUMMARY

The claimed subject matter relates to a non-volatile memory ("NVM") architecture that provides for NVM array (s) to work in Fowler-Norhiem ("FN") program and erase modes. Conventional NOR architecture and technology limits programming performance throughput since it generally utilizes hot electron ejection. Erase throughput is also limited since it uses hot hole injection. In accordance with aspects described herein, an NVM architecture utilizing FN program/erase capable memory cells enables legacy NOR devices to improve programming and erase throughput and have potentially the same programming and erase performance as NAND devices without sacrificing the conventional NOR architecture read speed. More particularly, NAND power consumption is matched. Present NOR technologies use charge injection to program and erase, thus limiting program and erase time and consuming more power during program and erase operations. By utilizing FN program/erase (e.g., like in NAND technology), the novel NVM architecture reduces power consumption of present NOR devices and achieves faster programming and erase times than present NOR devices.

Aspects of the NVM architecture include programming and erasing NVM cells using FN tunneling. Compared to traditional NOR architecture, the novel NVM architecture of the claimed subject matter has various advantages. No select device is required to carry hot electron injection program current to a particular bit line—if added, the select device does not need to be sized based on traditional NOR architecture. Further, a drain pump circuit does not need to be sized to provide hot electron injection program current to a particular bit line. Bit-line IR drop issues are eliminated or mitigated since FN tunneling current is negligible. Also, there are no (or nominal) bit-line to bit-line leakage issues. Parallel programming and mass erase of sectors as found in traditional NAND architecture is also possible. Unlike traditional NAND architecture, read speed is not compromised because there may be only one parasitic transistor in the read path of a particular bit line: traditional NAND architectures may have a minimum of 16 parasitic transistors in the read path of a particular bit line.

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject invention provides architectures and systems that achieve the benefits of fast flash memory read access times and fast program and erase times. In accordance with one aspect of the disclosed subject matter, an apparatus comprises an array of pairs of NVM cells coupled to enable FN tunneling program and erase of the NVM cells. In one embodiment, the array of NVM cells comprises a two or three dimensional array of a plurality of pairs of NVM cells electrically connected to word lines and bit lines. Each of the pairs of NVM cells comprises a first memory cell and a second memory cell. The first and second memory cells each comprise a first source/drain, a second source/drain, and a control gate. The control gate of the first memory cell of each of the pairs of NVM cells is electrically connected to one of the word lines, while the control gate of the second memory cell of each of the pairs of NVM cells is electrically connected to another one of the word lines.

The first source/drain of the first memory cell of each of the pairs of NVM cells is electrically connected to a bit line. The second source/drain of the first memory cell of each of the pairs of NVM cells is electrically connected to the first source/drain of the second memory cell of each of the pairs of NVM cells. Moreover, the second source/drain of the second memory cell of each of the pairs of NVM cells is electrically connected to another bit line.

In accordance with another aspect of the disclosed subject matter, the NVM architecture includes word line sharing, bit line connections alternating between every other word-line, word-line connections alternating between adjacent cell(s) along the word-line(s), programming using FN tunneling, and erasing using FN tunneling. In accordance with one aspect of the disclosed subject matter, the NVM architecture includes bit line sharing, no sharing of word lines, programming using FN tunneling, and erasing using FN tunneling.

Other aspects of the disclosed subject matter include a system that comprises a program component that programs one or more pairs of NVM cells of an array of NVM cells using FN tunneling. Further, the system comprises an erase component that erases the one or more pairs of NVM cells using FN tunneling. In addition, the system comprises a read component that reads one or more NVM cells of the array of NVM cells.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a nonvolatile memory array partitioning architecture and system to utilize single level cells and multilevel cells within the architecture are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
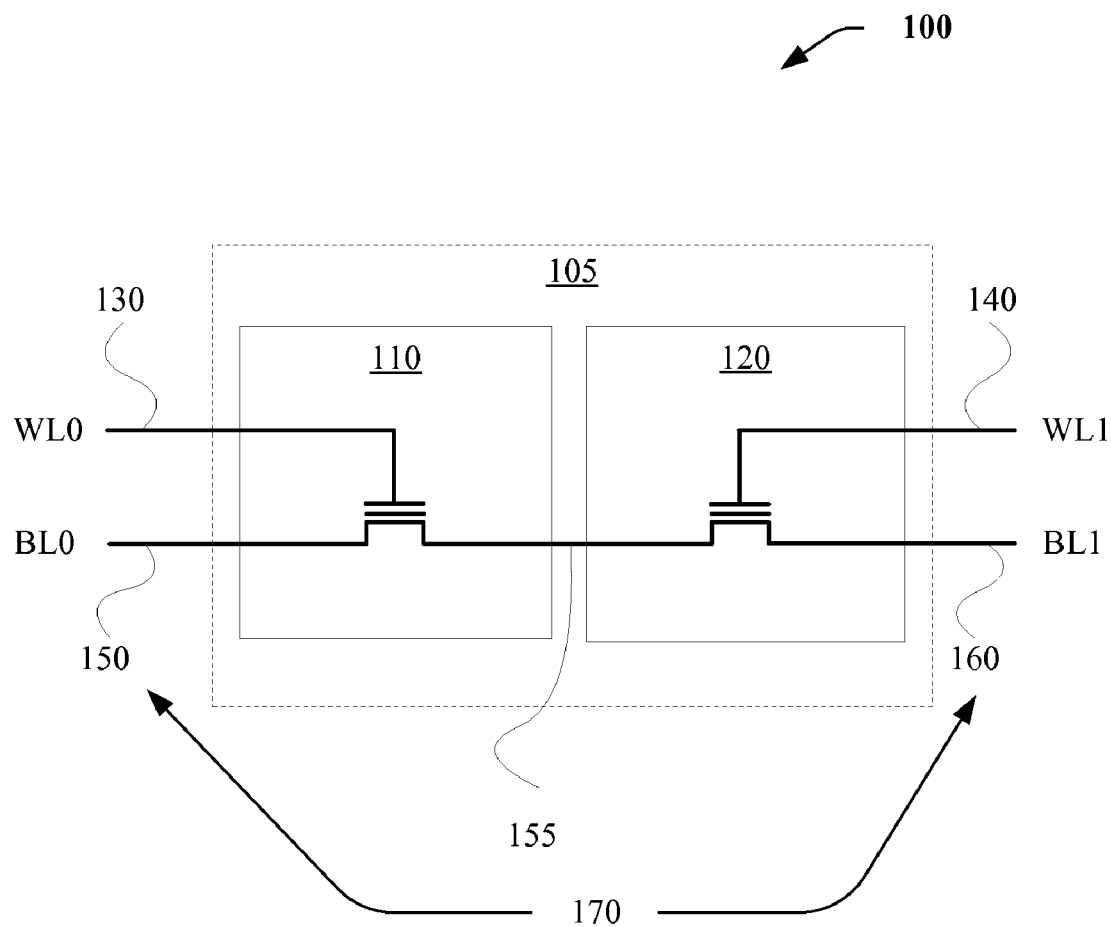
FIG. 1 is a schematic diagram illustrating a pair of NVM cells of the NVM architecture electrically connected to bit lines and word lines to work in FN program and erase modes, in accordance with an embodiment of the invention.

Embodiments of the invention include NVM architectures and systems that improve the program and erase times of nonvolatile memory devices, and allow for fast memory read access time of the nonvolatile memory devices. FIG. 1 is a schematic diagram 100 illustrating a pair of NVM cells 105 of an NVM architecture electrically connected to bit lines and word lines to work in FN program and erase modes, in accordance with an embodiment of the invention. A control gate of a first memory cell 110 is connected to a word line 130 (labeled "WL0"), and a control gate of a second memory cell 120 is connected to another word line 140 (labeled "WL1"). A first source/drain of the first memory cell 110 is connected to a first bit line 150 (labeled "BL0") of a pair of bit lines 170, and a second source/drain of the second memory cell 120 is connected to a second bit line 160 of the pair of bit lines 170.

In one embodiment, the first memory cell 110 and second memory cell 120 of the pair of NVM cells 105 is a NOR flash memory (e.g., single-bit flash memory, multi-bit flash memory). The NVM architecture allows for FN electric fields to be applied between the word lines and bit lines (e.g., between "WL0" and "BL0", between "WL1" and "BL1") to program memory cells (e.g., to program memory cells 110 and 120). Unlike traditional NOR architectures that require a select device to carry hot electron injection program/erase current to memory cells, no select device is required to carry the hot electron injection program/erase current in the NVM architecture because FN tunneling methods are utilized. Moreover, if a select device is used, it does not have to be sized based on traditional NOR architecture because it does not have to carry high hot electron injection program/erase current to a particular bit line. Instead, FN electric fields are selectively applied between word and bit lines to program a particular cell. Therefore, unlike traditional NOR architecture, the NVM architecture allows for reduced power consumption and fast programming time.

The NVM architecture also achieves fast erase times because it allows for FN electric fields to be selectively applied between the substrate of the NVM architecture and word and bit lines (e.g., "WL0", "WL1", "BL0", and "BL1") to erase memory cells (e.g., to erase memory cells 110 and 120). Further, unlike traditional NOR architecture, mass erase of sectors (e.g., like in NAND architecture) is possible. In addition, the NVM architecture allows for FN electric fields to be applied between word lines and bit lines (e.g., between "WL0", "BL0", "WL1", and "BL1") to read memory cells (e.g., to read memory cells 110 or 120). Unlike traditional NAND architecture, NVM architecture does not compromise read access time because there may be only one parasitic transistor in the read path of a particular bit line (e.g., memory cell 110 in the read path of memory cell 120).

Figure 2:
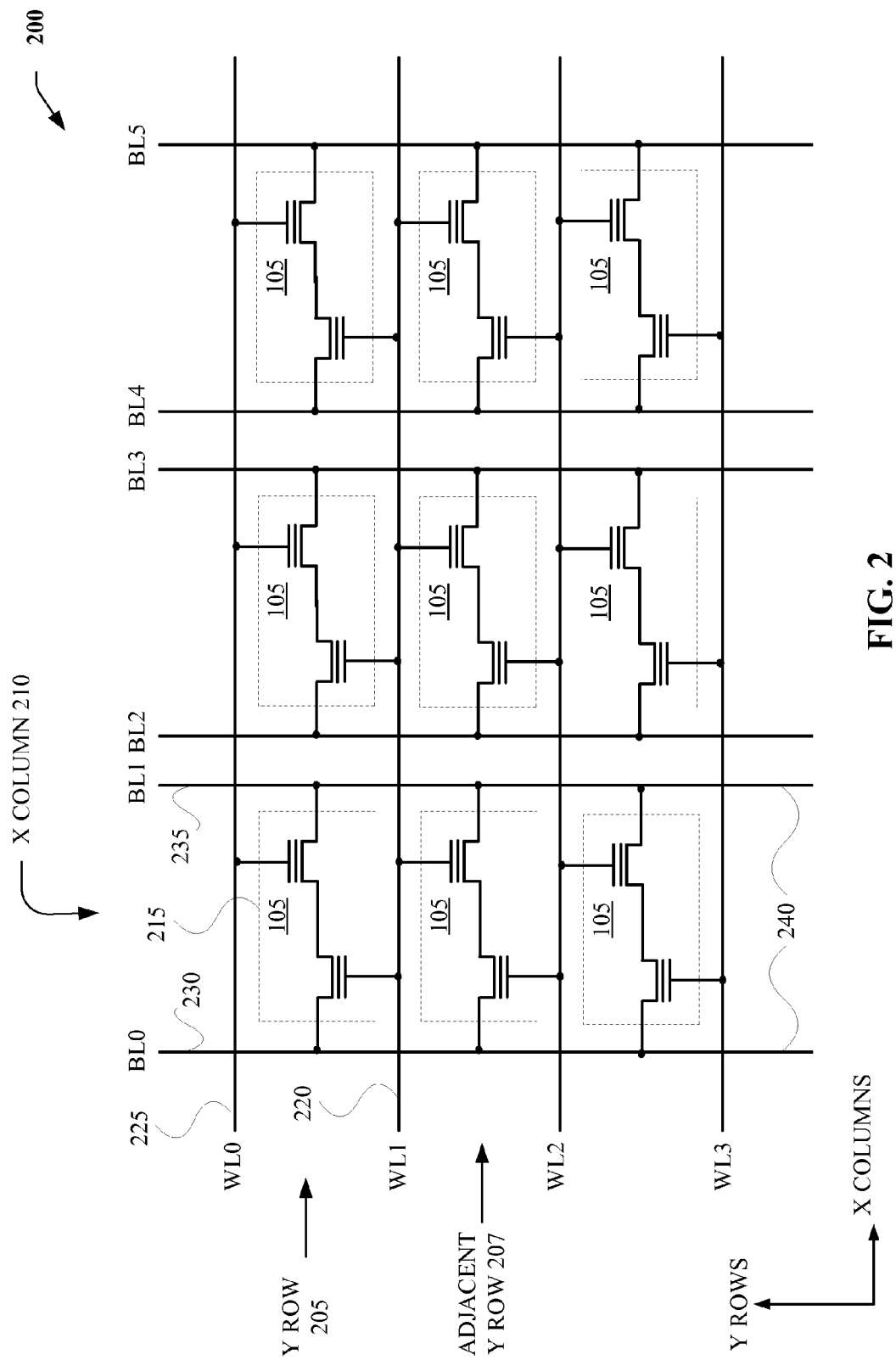
FIG. 2 is a schematic diagram illustrating how pairs of NVM cells of the NVM architecture, in connection with the features described herein, can be coupled together to form a more complex array, in accordance with an embodiment of the invention.

FIG. 2 is a schematic diagram illustrating how pairs of NVM cells of the NVM architecture, in connection with the features described herein, can be coupled together to form a more complex array, in accordance with an embodiment of the invention. Two-dimensional array 200 includes pairs of NVM cells arranged in x columns and y rows. X column 210 and y row 205 are representative of each of the x columns and y rows of two-dimensional array 200. In the embodiment of the invention illustrated by FIG. 2, at least one of the control gates of the memory cells of the pairs of NVM cells of y row 205 is electrically connected to one of the control gates of the memory cells of each of the pairs of NVM cells of an adjacent y row 207, illustrating word line sharing.

Further, bit line connections to memory cells of pairs of NVM cells alternate between every other word-line, e.g., each memory cell of a pair of NVM cells 215 is programmed with a pair of dedicated bit lines 240 (i.e., "BL0" (at 230) and "BL1" (at 235)). Unlike traditional NOR architecture, there are no (or nominal) bit-line leakage issues because each memory cell is programmed with a pair of dedicated bit lines (e.g., the first memory cell of memory cell pair 215 is programmed by applying an FN electric field between word line "WL1" (at 220) and bit line "BL0" (at 230)). These dedicated bit lines also allow parallel programming as found in traditional NAND architecture.

Figure 3:
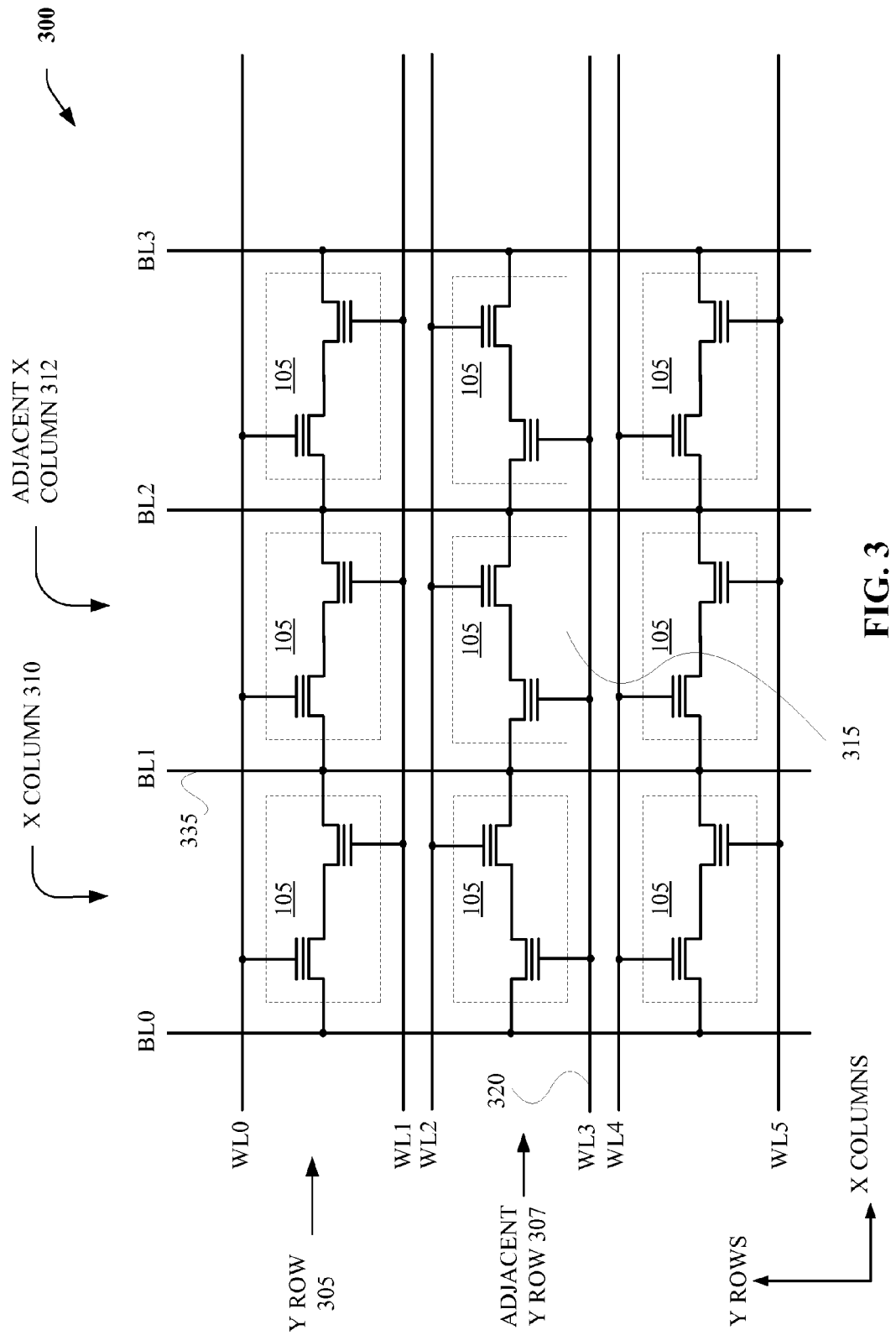
FIG. 3 illustrates an alternative embodiment of how pairs of NVM cells of the NVM architecture, in connection with the features described herein, can be coupled together to form a more complex array, in accordance with an embodiment of the invention.

FIG. 3 illustrates an alternative embodiment of how pairs of NVM cells of the NVM architecture, in connection with the features described herein, can be coupled together to form a more complex array, in accordance with an embodiment of the invention. Two-dimensional array 300 includes pairs of NVM cells arranged in x columns and y rows. X column 310 and y row 305 are representative of each of the x columns and y rows of two-dimensional array 300. The alternative embodiment of the invention illustrated by FIG. 3 minimizes the physical design area of the NVM architecture by bit line sharing, i.e., the second source/drain of the second memory cell of each of the pairs of NVM cells of at least one x column 310 is electrically connected the first source/drain of the first memory cell of each of the pairs of NVM cells of an adjacent x column 312.

In order to program and erase memory cells of the two-dimensional array 300 using FN tunneling, no word lines are shared, e.g., no control gates of the memory cells of the pairs of NVM cells of y row 305 are electrically connected to one of the control gates of the memory cells of each of the pairs of NVM cells of an adjacent y row 307. Thus, the first memory cell of memory cell pair 315 is programmed by applying an FN electric field between word line "WL3" (at 320) and bit line "BL1" (at 335)). Further, in the embodiment of the NVM architecture illustrated by FIG. 3, at least one of the control gates of the memory cells of each of the pairs of NVM cells of a y row is electrically connected to a word line that is adjacent to another word line electrically connected to at least one of the control gates of the memory cells of each of the pairs of NVM cells of an adjacent y row.

Figure 4:
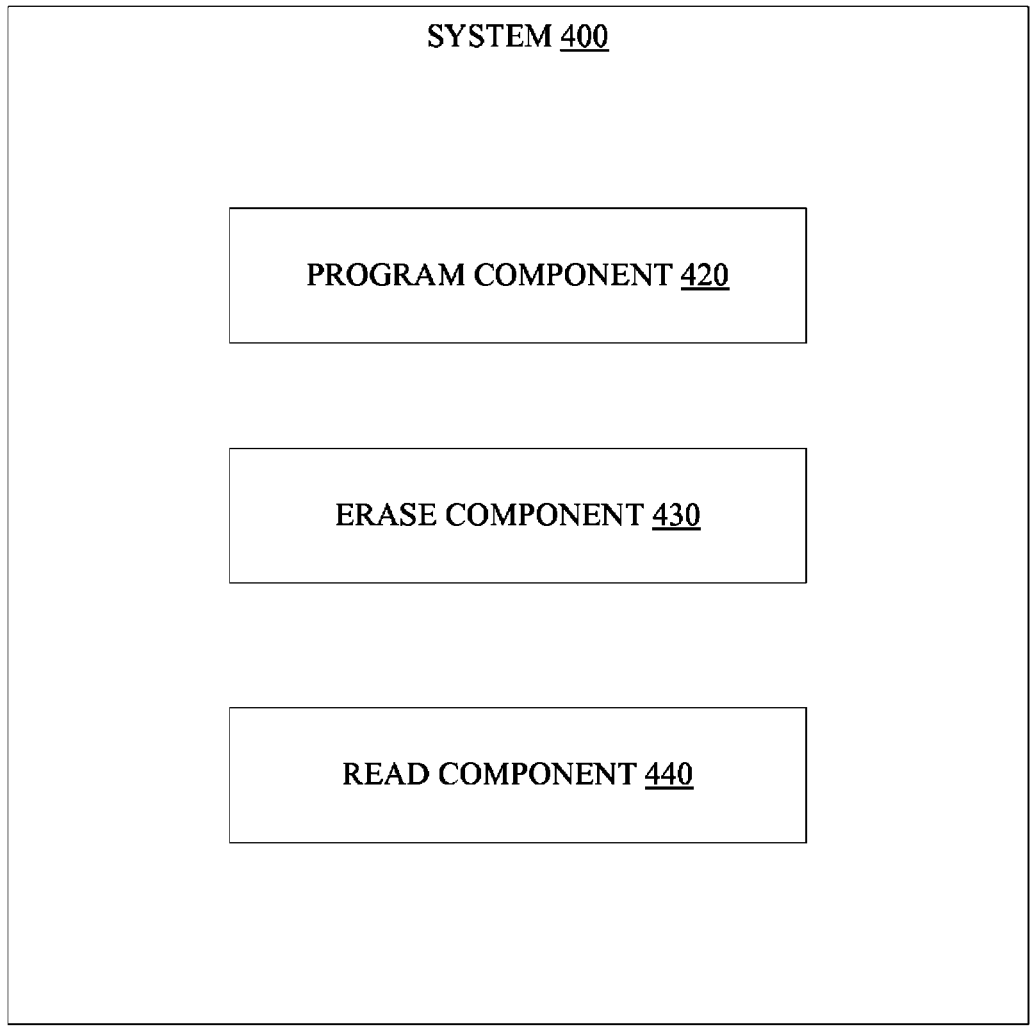
FIG. 4 is a demonstrative system for programming, erasing, and reading one or more NVM cells of the NVM architecture, in accordance with an embodiment of the invention.

FIG. 4 is a demonstrative system 400 for programming, erasing, and reading one or more NVM cells of the NVM architecture, in accordance with an embodiment of the invention. A program component 420 can program one or more NVM cells of the NVM architecture using FN tunneling. An erase component 430 can erase the one or more NVM cells of the NVM architecture using FN tunneling. Further, a read component 440 can read the one or more NVM cells of the NVM architecture. System 400 and the systems and processes explained below can be applied to each NVM cell of memory cell pairs 105 within the NVM architecture.

Further, system 400 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit ("ASIC") or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

Figure 5:
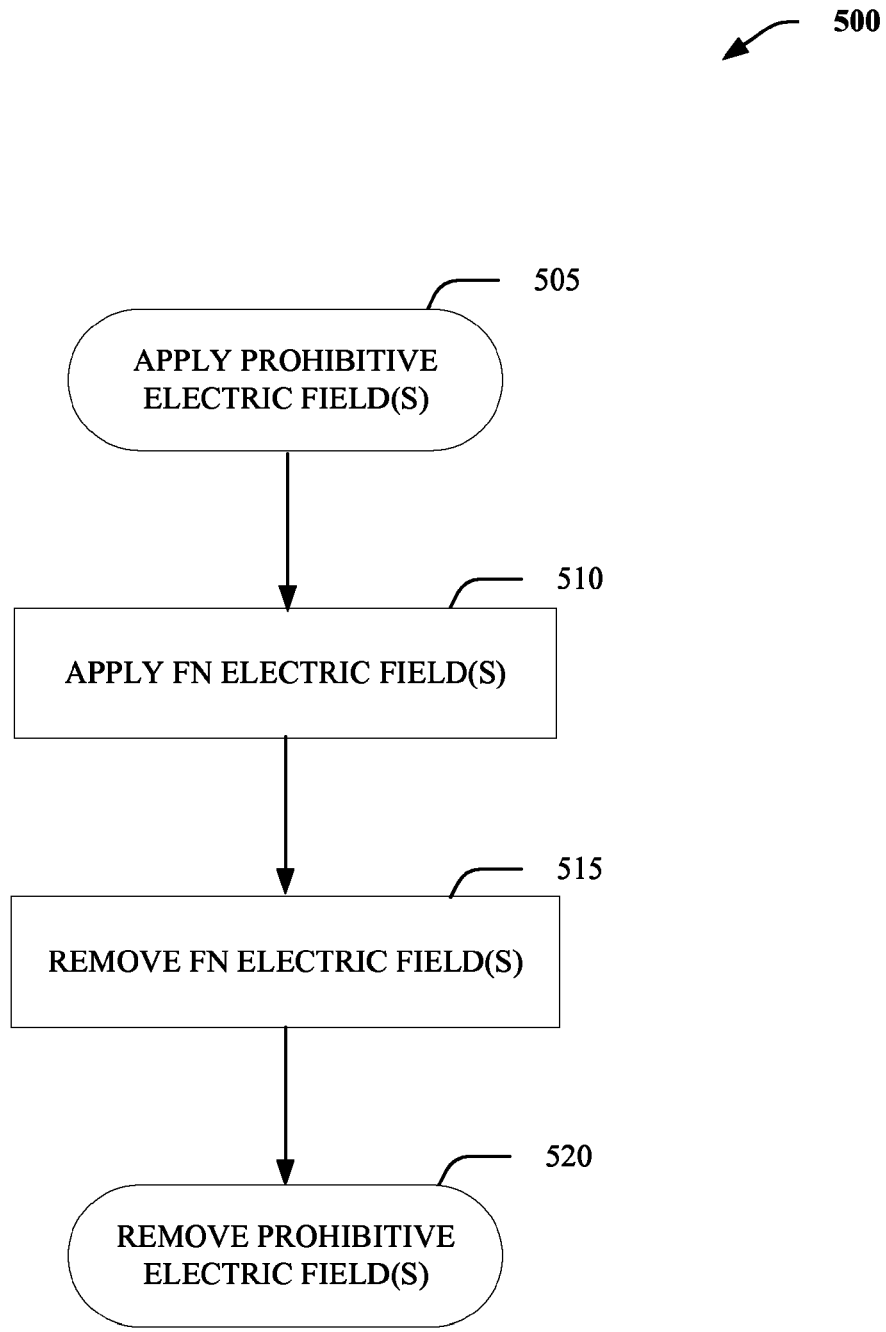
FIG. 5 is a flow diagram illustrating a process for programming memory cells of the NVM architecture utilizing FN tunneling, in accordance with an embodiment of the invention.

FIG. 5 is a flow diagram illustrating process 500 programming memory cells of the NVM architecture utilizing FN tunneling, in accordance with an embodiment of the invention. In a process block 505, program component 420 can apply one or more prohibitive electric fields to prevent charge from being stored in one or more memory cells of the NVM architecture. In one embodiment, the one or more prohibitive electric fields can be applied between one or more word lines (connected to the control gates of the one or more NVM cells) and one or more bit lines (connected to the first or second source/drain of the one or more NVM cells).

Process 500 continues to a process block 510, in which program component 420 can apply one or more FN electric fields between one or more other word and bit lines to store electrical charge in one or more other NVM cells using FN tunneling. In one embodiment, the one or more FN electric fields can be applied between one or more other word lines, connected to the control gates of the one or more other NVM cells, and one or more other bit lines connected to the first or second source/drain of the one or more other NVM cells. Further, the FN electric field can cause charge to be stored on a floating a gate of the NVM memory cell, and the prohibitive electric field can prevent charge from being stored on the floating gate of the NVM memory cell. In other embodiments, the FN electric field can cause charge to be stored in other NVM cells, and the prohibitive electric field can prevent charge from being stored in the other NVM cells.

Figure 6:
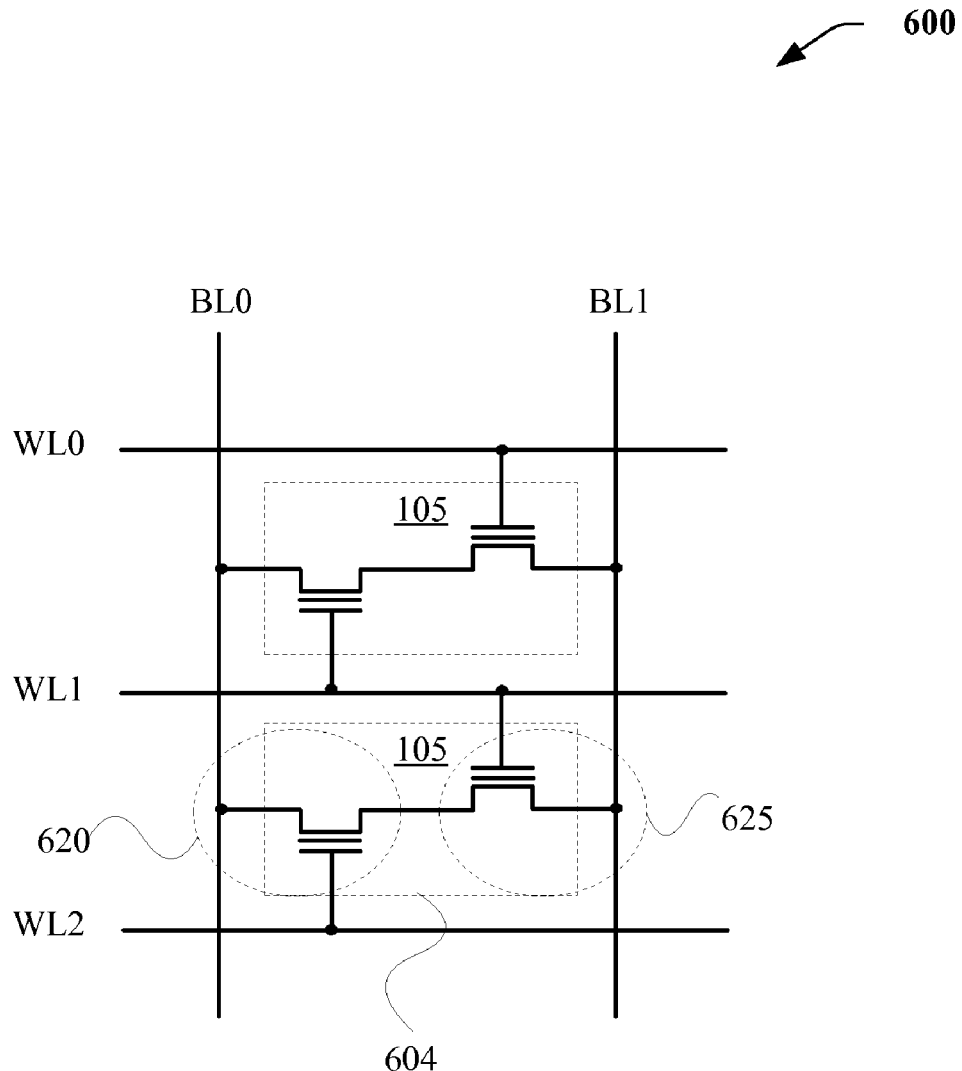
FIG. 6 is a schematic diagram illustrating how NVM cells of the NVM architecture, in connection with the features described herein, can be programmed within an array using FN tunneling, in accordance with an embodiment of the invention.

In process block 515, the one or more FN electric fields can be removed. Process 500 can then continue to a process block 520, in which the one or more prohibitive electric fields can be removed. FIG. 6 is a schematic diagram 600 illustrating process 500 programming a memory cell 625 of a two dimensional array of a plurality of pairs of NVM cells using FN tunneling, in accordance with an embodiment of the invention. In process block 505, program component 420 applies the prohibitive electric field between word line "WL2" (connected to the control gate of memory cell 620 of NVM cell pair 604) and the bit line "BL0" (connected to the first source/drain of memory cell 620). The prohibitive electric fields prevent charge from being stored in memory cell 620.

Process 500 continues to process block 510, in which program component 420 applies an FN electric field between word line "WL1" (connected to the control gate of memory cell 625) and bit line "BL1" (connected to the second source/drain of memory cell 625). The FN electric field stores charge in memory cells 625 using FN tunneling. Dedicated bit lines "BL0" and "BL1" reduce bit-line to bit-line leakage between memory cell 625 and, particularly, memory cells in adjacent columns. In addition, unlike traditional NAND architecture, a drain pump circuit used to program memory cell 625 does not need to be sized to provide hot electron injection program current—it merely must provide a high voltage to generate the FN electric fields. Moreover, unlike traditional NOR architecture, in which the source of each memory cell is connected to a common source node that must be sized to carry hot electron and hot hole injection programming currents, each source of each NVM cell of the NVM architecture connects directly to its respective bit line and merely carries FN electric fields; therefore, unlike traditional NOR architectures, valuable layout real real estate does not have to be sacrificed in order to size current paths large enough to carry electron injection current.

Figure 7:
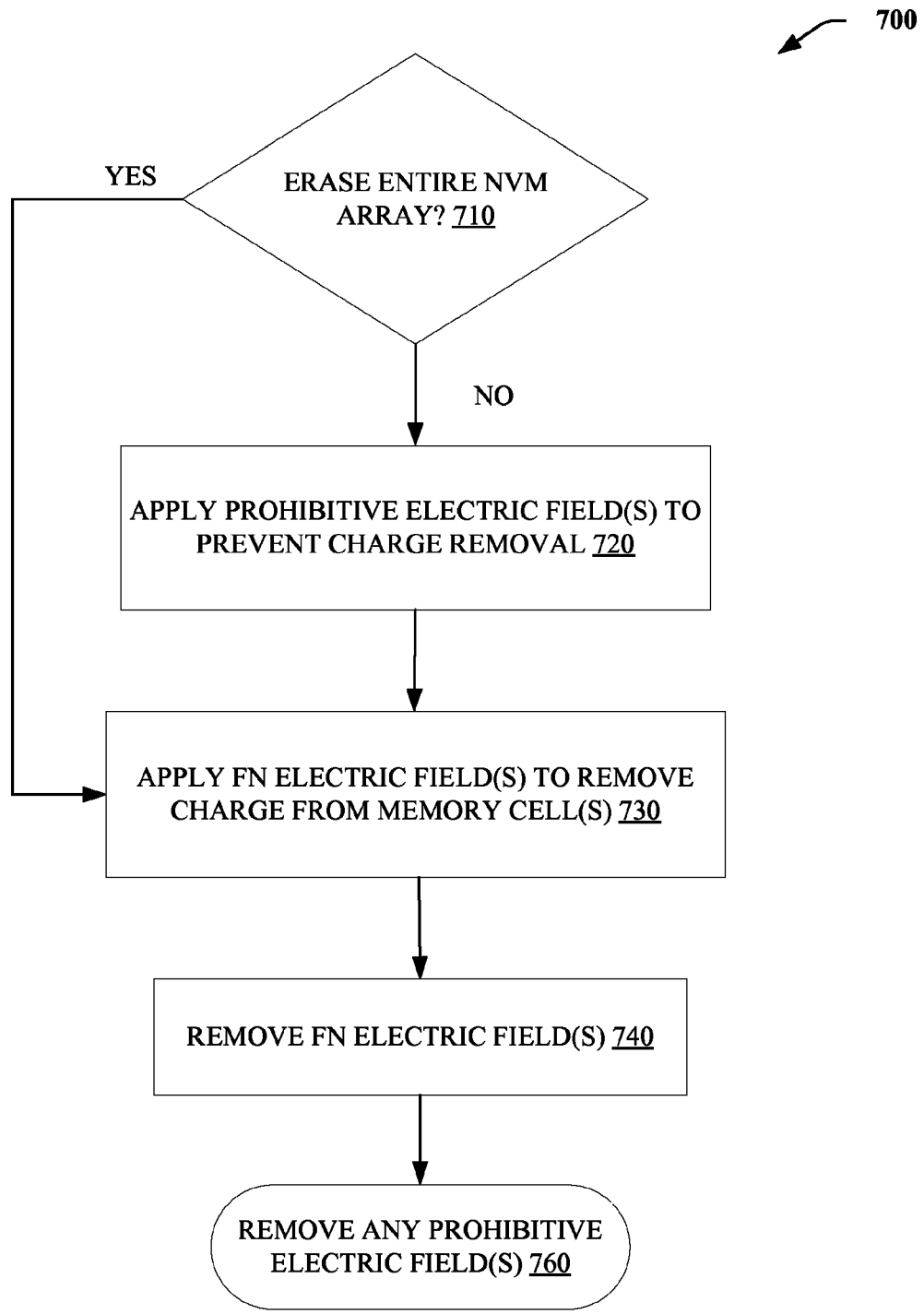
FIG. 7 is a flow diagram illustrating a process for erasing memory cells of the NVM architecture utilizing FN tunneling, in accordance with an embodiment of the invention.

FIG. 7 is a flow diagram illustrating a process 700 for erasing memory cells of the NVM architecture utilizing FN tunneling, in accordance with an embodiment of the invention. In one embodiment, the one or more FN electric fields can be applied between a substrate of the array of NVM cells and one or more word lines and bit lines. Further, the FN electric field can cause charge to be removed from a floating a gate of the NVM memory cell. In other embodiments, the FN electric field can cause charge to be removed from other NVM cells.

In a decision block 710, a determination can be made as to whether to erase the entire array of NVM cells. If part of the array is to be erased, process 700 continues from decision block 710 to process block 720, in which the erase component 430 can apply one or more prohibitive electric fields between one or more word and bit lines connected to one or more NVM cells and the substrate of the array of NVM cells to prevent charge from being removed from the one or more NVM cells. Process 700 then continues from process block 720 to process block 730. If the entire array is to be erased, decision block 710 also continues to process block 730, in which erase component 430 can apply one or more FN electric fields between the substrate of the array of NVM cells and one or more other word and bit lines connected to one or more other NVM cells.

Figure 8:
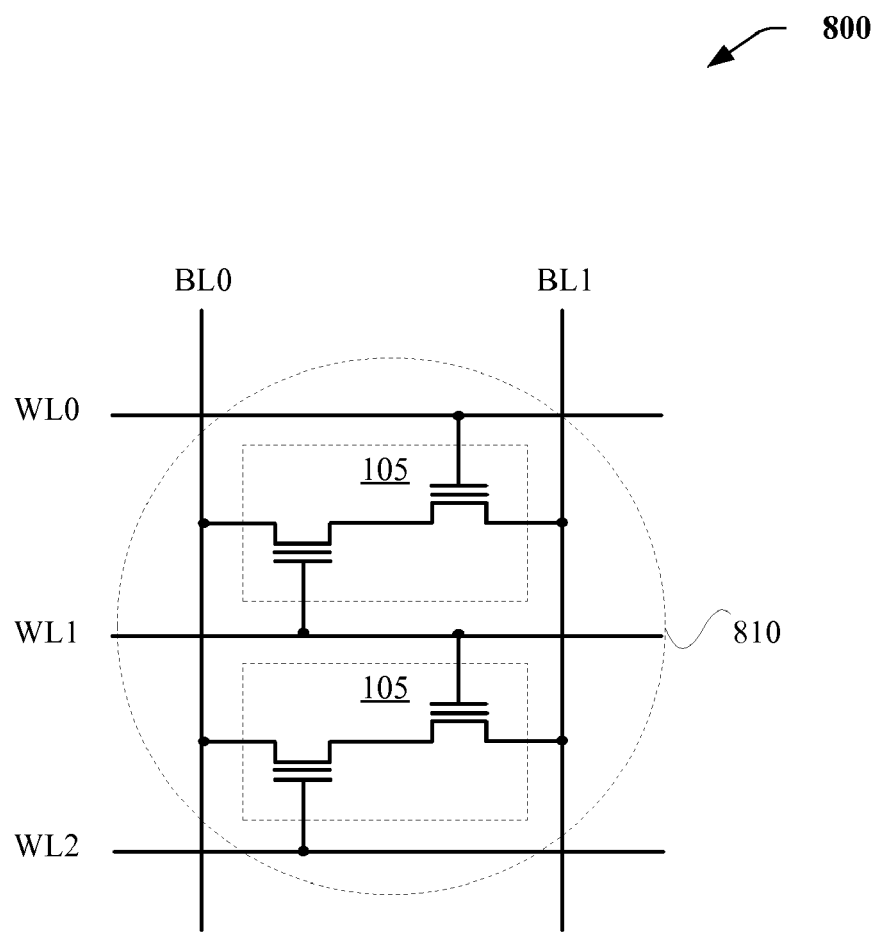
FIG. 8 is a schematic diagram illustrating how NVM cells of the NVM architecture, in connection with the features described herein, can be erased within an array using FN tunneling, in accordance with an embodiment of the invention.

Process 700 then continues from process block 730 to a process block 740, in which the erase component 430 removes the one or more FN electric fields between the substrate of the array of NVM cells and the one or more other word and bit lines of the array of NVM cells. Process 700 next continues to process block 760, in which the erase component 430 removes the one or more prohibitive electric fields between the one or more word and bit lines and the substrate of the array of NVM cells. FIG. 8 is a schematic diagram illustrating erasing memory cells 810 of a two dimensional array of a plurality of pairs of NVM cells using FN tunneling, in accordance with an embodiment of the invention. In process block 730, erase component 430 applies the FN electric field between the substrate of the two dimensional array 800 and the word and bit lines of memory cells 810 (i.e., "WL0", "WL1," "WL2", "BL0", and "BL1"). The FN electric field causes charge to be removed from memory cells 810.

Figure 9:
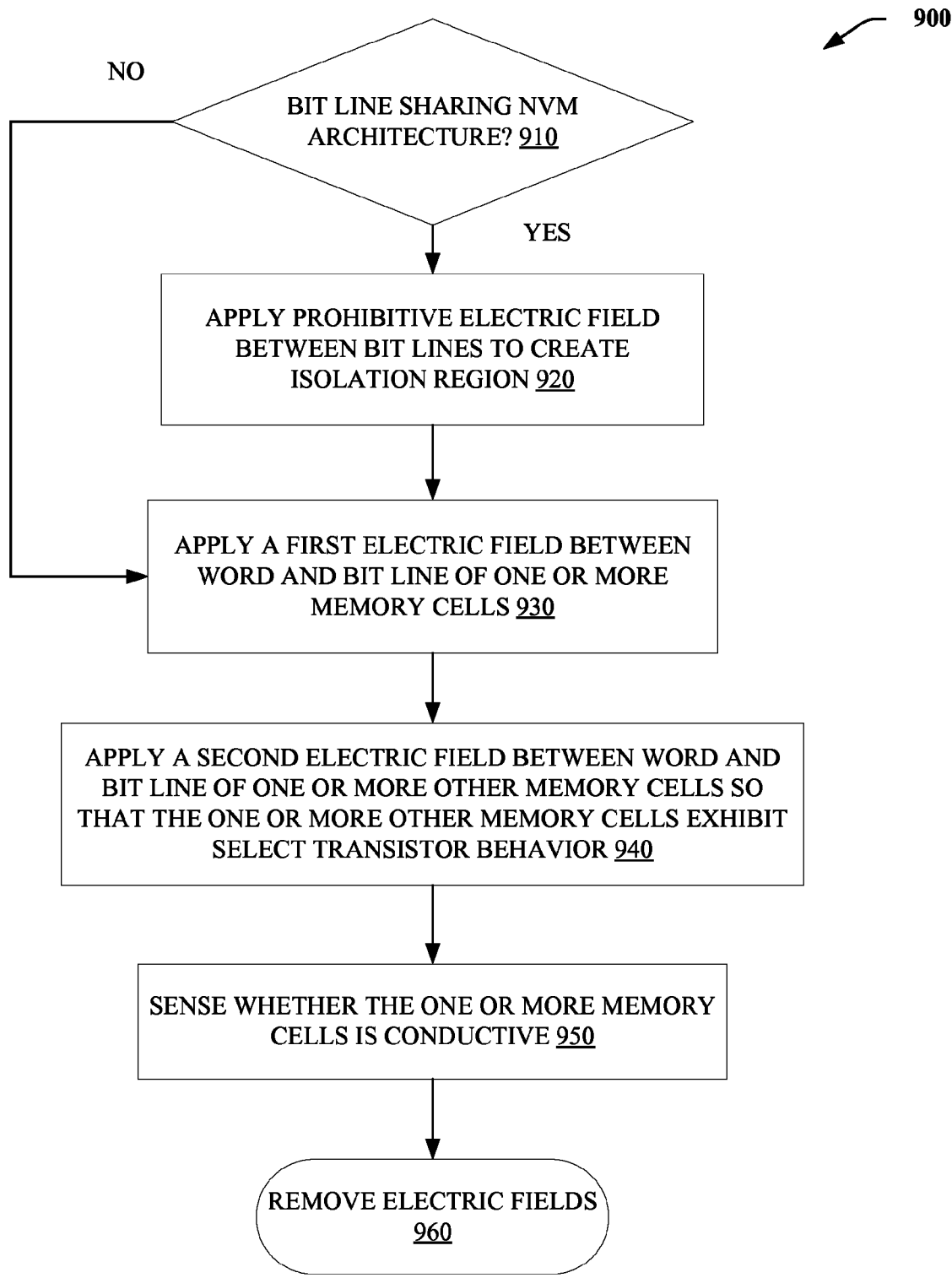
FIG. 9 is a flow diagram illustrating a process for reading memory cells of the NVM architecture, in accordance with an embodiment of the invention.

FIG. 9 is a flow diagram illustrating a process for reading memory cells of the NVM architecture, in accordance with an embodiment of the invention. In a decision block 910, it can be determined whether the NVM architecture comprises bit line sharing. If the NVM architecture comprises bit line sharing, decision block 910 continues to process block 920, in which read component 540 can apply one or more prohibitive electric fields between one or more bit lines to create one or more isolation regions that prevent charge transfer between bit lines of an array of NVM cells. Process 900 then continues to process block 930, in which read component 540 can apply a first electric field between a word and bit line of one or more NVM cells. If the NVM architecture does not comprise bit line sharing, process 900 continues from decision block 910 to process block 930, in which the read component 540 can apply the first electric field to one or more NVM cells.

Process 900 continues to a process block 940, in which read component 540 can apply a second electric field between a word and bit line of one or more other NVM cells, so that the one or more other memory cells exhibit select transistor behavior. Process 900 continues from process block 940 to a process block 950, in which read component 540 can sense whether the one or more NVM cells is conductive. Process 900 continues from process 950 to a process block 960, in which read component 540 can remove the second electric field, remove the first electric field, and remove any prohibitive electric fields. In one embodiment, the order of removing the electric fields is inverse from the order that the electric fields are applied. In other embodiments, the order of removing the electric fields may vary with the location of memory cells within the array of NVM cells or other purposes.

Figure 10:
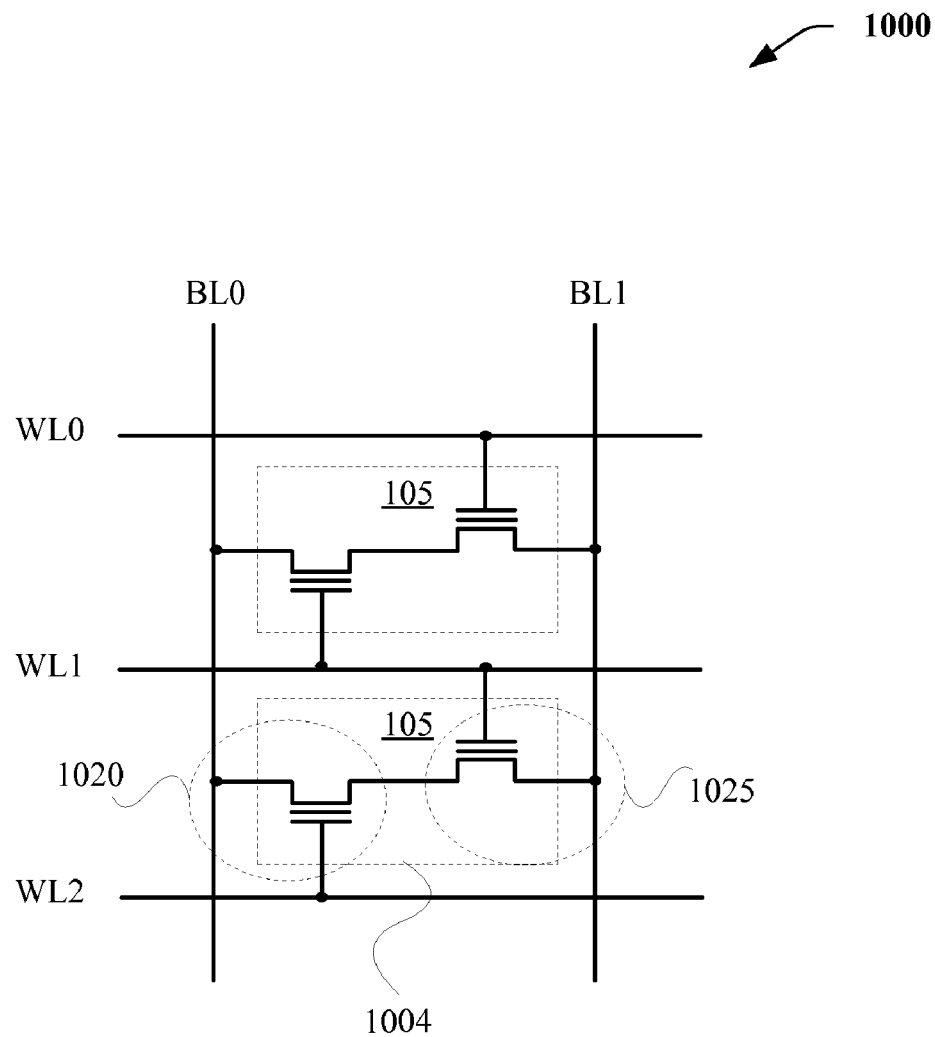
FIG. 10 is a schematic diagram illustrating how NVM cells of the NVM architecture, in connection with the features described herein, can be read within an array, in accordance with an embodiment of the invention.

FIG. 10 is a schematic diagram 1000 illustrating process 900 reading memory cell 1020 within a two dimensional array of a plurality of pairs of NVM cells, in accordance with an embodiment of the invention. In the embodiment, the NVM architecture does not comprise bit line sharing. Memory cell 1020 is the first memory cell of a pair of memory cells 1004. In process block 930, read component 540 applies the first electric field between the word line "WL2" (connected to the control gate of memory cell 1020) and bit line "BL0" (connected to the first source/drain of memory cell 1020). In process block 940, read component 540 applies the second electric field between word line "WL1" (connected to the control gate of memory cell 1025) and bit line "BL1" (connected to the second source/drain of memory cell 1025). The second electric field causes memory cell 1025 to exhibit select transistor behavior. In process block 950, read component 540 senses whether memory cell 1020 is conductive.

A variety of methods and techniques may be utilized to sense whether the one or more NVM cells is conductive. In one embodiment, one bit line connected to a NVM cell of a pair of NVM cells can be utilized as a source potential (e.g., "BL0" to sense whether memory cell 1020 is conductive), while another bit line connected to another NVM cell of the pair of NVM cells can be utilized as a drain potential (e.g., "BL1" to sense whether memory cell 1020 is conductive). One method of sensing includes pre-charging the bit line utilized as a drain potential, and sensing the rate of discharge of the bit line. Another method of sensing includes providing a fixed voltage to either the bit line utilized as the source potential or the bit line utilized as the drain potential, and sensing either the bit line utilized as the drain potential or the bit line utilized as the source potential.

Figure 11:
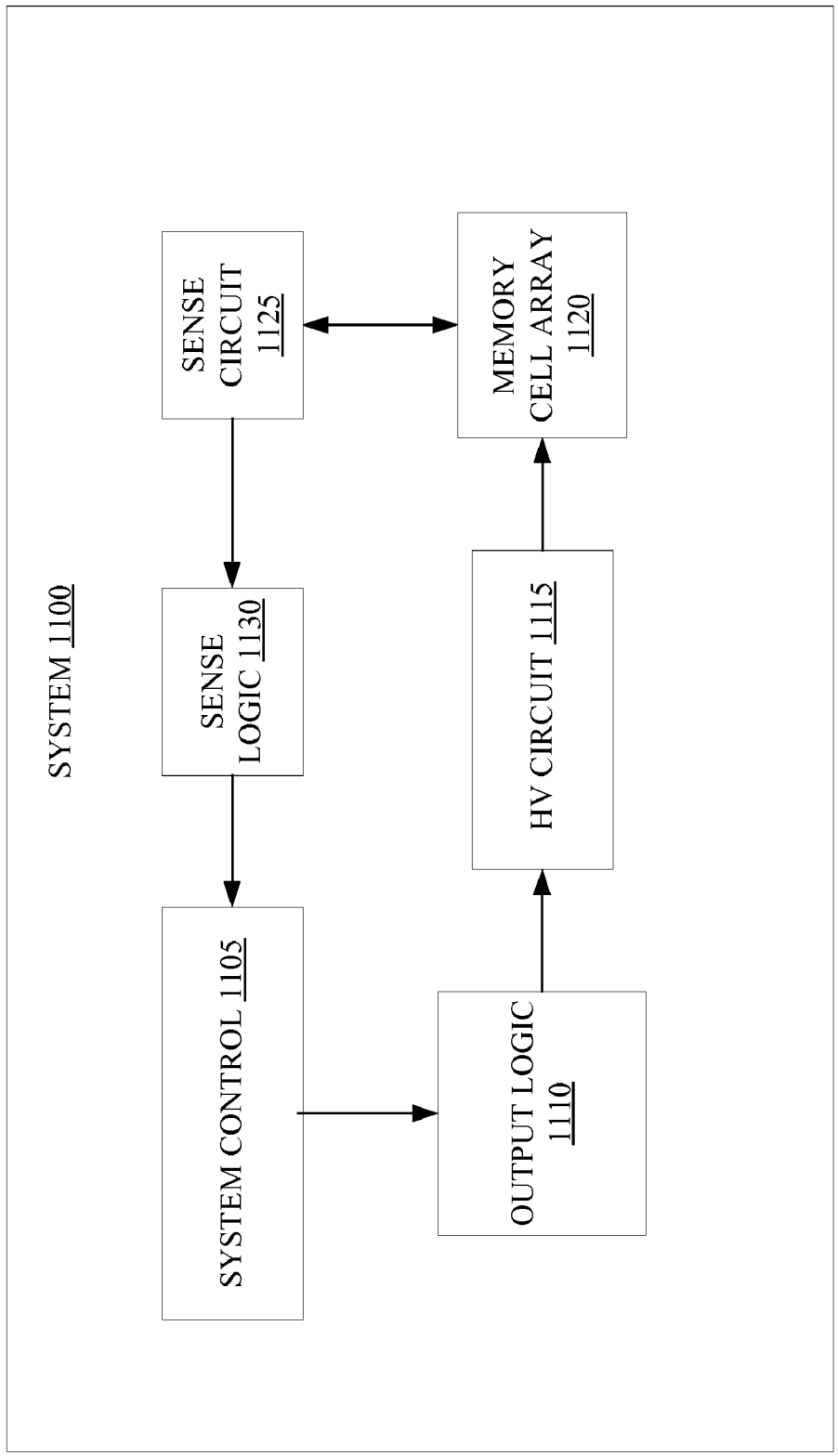
FIG. 11 is a demonstrative system for programming, erasing, and reading memory cells of the NVM architecture, in accordance with an embodiment of the invention.

FIG. 11 is a block diagram illustrating a demonstrative system 1100 for programming, erasing, and reading one or more NVM cells of a two or three dimensional memory cell array of a plurality of pairs of NVM cells, in accordance with an embodiment of the invention. A system control block 1105 can receive input from a sense logic block 1130 and can control an output logic block 1110. System control block 1105 may include a computer that contains a central processing unit for making computations and performing various program and data transfers, and may also contain memory for program and data storage.

Output logic block 1110 can receive information from system control block 1105, and may include decode logic that decodes the information received from system control block 1105 to control high voltage ("HV") circuit block 1115. HV circuit block 1115 can receive control logic from output logic block 1110 and can translate the control logic to apply electric fields and current to one or more NVM cells of a plurality of pairs of NVM cells of a two or three dimensional memory cell array 1120. The electric fields applied by HV circuit block 1115 may comprise high voltages, and may be used to program and erase the one or more NVM cells of the plurality of pairs of NVM cells of the two or three dimensional memory cell array 1120 using FN tunneling. Moreover, the electric fields and current generated by HV circuit block 1115 may be used to read the one or more NVM cells of the plurality of pairs of NVM cells of the two or three dimensional memory cell array 1120.

The memory cells of the plurality of pairs of NVM cells may comprise a NOR flash memory (e.g., single-bit flash memory, multi-bit flash memory). Sense circuit block 1125 can receive voltage and current generated by memory cell array 1120, and can transmit signals to sense logic block 1130. Sense circuit block may include multiple static references, comparators, and any other elements that comprise sense circuits. Sense logic block 1130 can receive signals sent by sense circuit block 1125 and can translate the signals into logic that can be received by system controller 1105. Sense logic 1130 may translate the signals using encoding logic. It should be understood by a person of ordinary skill in the art having the benefit of the instant disclosure that system 1100 may comprise any hardware and/or software necessary to perform the above illustrated embodiments of the invention.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events.

Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ).

Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter. Moreover, the word "exemplary" is used herein to mean serving as an example, instance, or illustration. Any aspect or design described herein as "exemplary" is not necessarily to be construed as preferred or advantageous over other aspects or designs.

Figure 12:
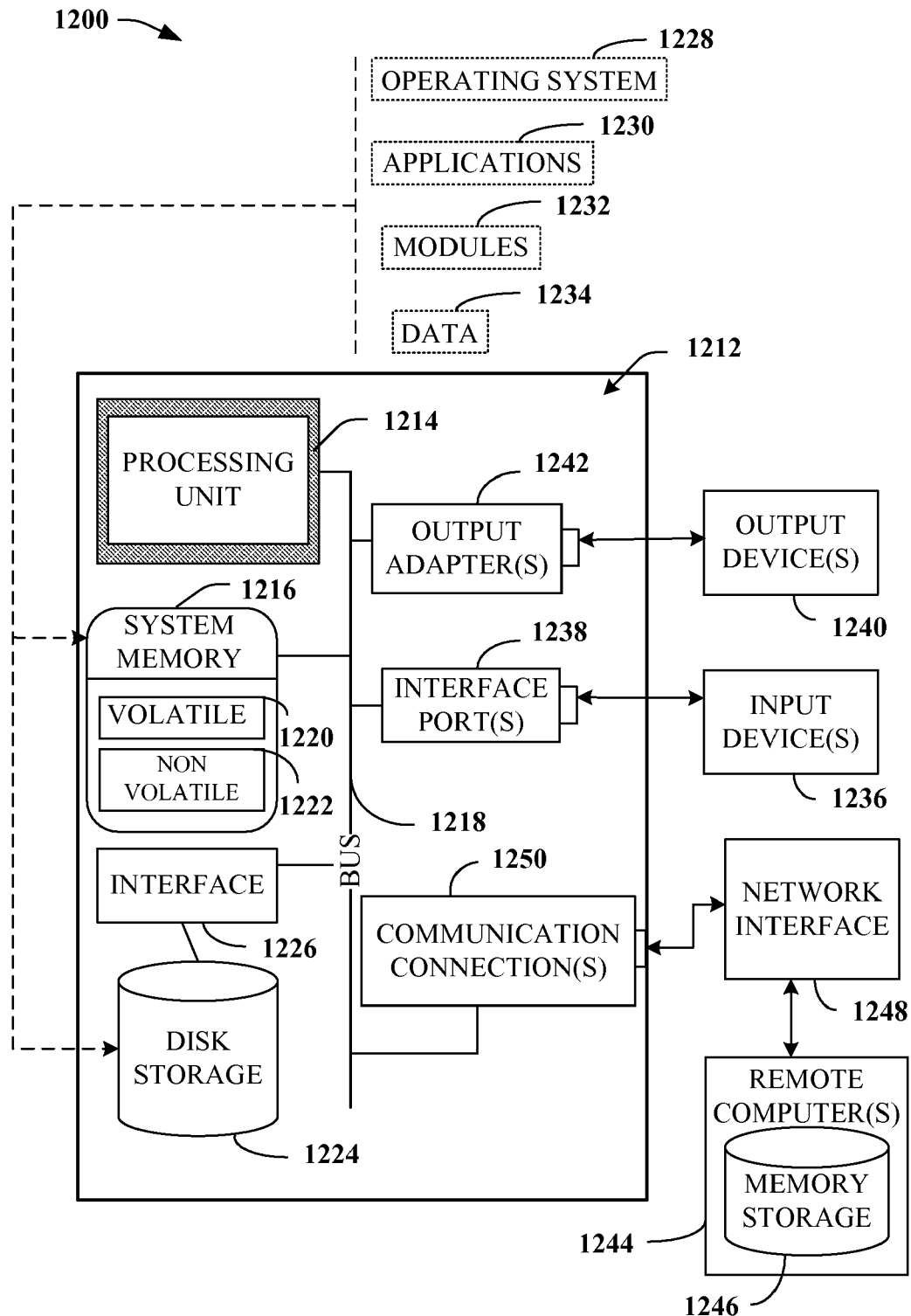
FIG. 12 is a schematic block diagram illustrating a suitable operating environment.
Figure 13:
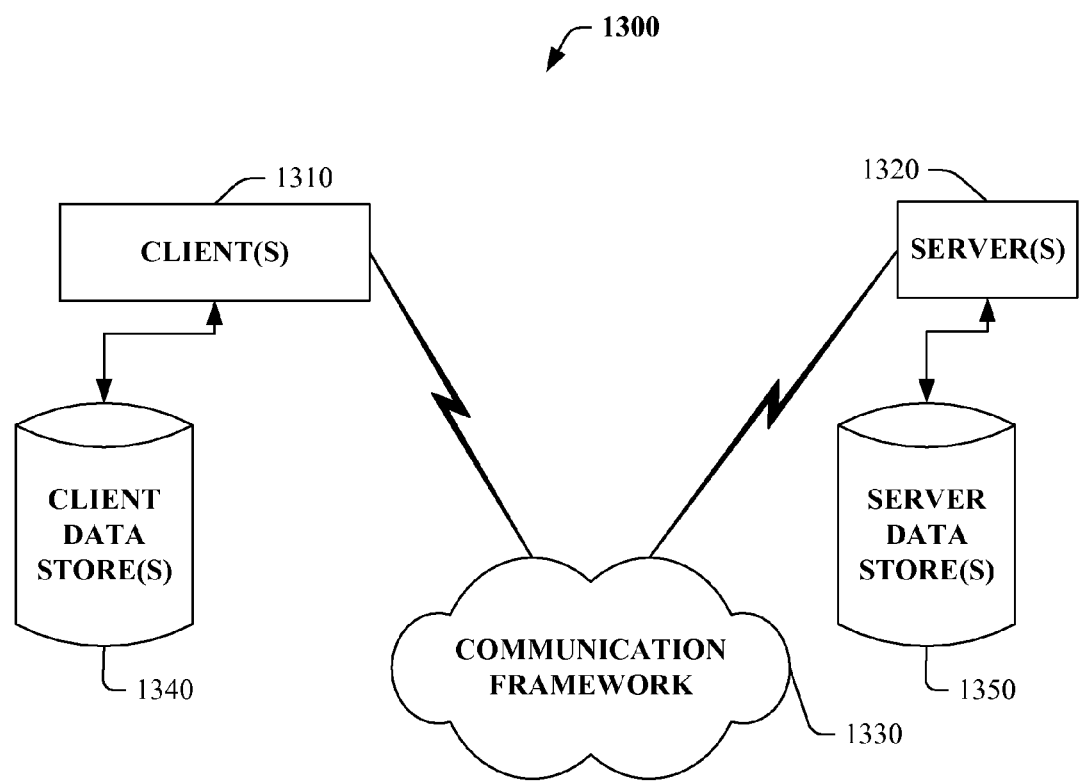
FIG. 13 is a schematic block diagram of a sample-computing environment.

In order to provide a context for the various aspects of the disclosed subject matter, FIGS. 12 and 13, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types.

Moreover, those skilled in the art will appreciate that the inventive methods may be practiced with other computer system configurations, including single-processor or multi-processor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 12, a suitable environment 1200 for implementing various aspects of the claimed subject matter includes a computer 1212. The computer 1212 includes a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include ROM, PROM, EPROM, EEPROM, or flash memory. Volatile memory 1220 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ES-DRAM), Synchlink DRAM (SLDRAM), Rambus direct RAM (RDRAM), direct Rambus dynamic RAM (DRDRAM), and Rambus dynamic RAM (RDRAM).

Computer 1212 also includes removable/non-removable, volatile/non-volatile computer storage media. FIG. 12 illustrates, for example, a disk storage 1224. Disk storage 1224 includes, but is not limited to, devices like a magnetic disk drive, floppy disk drive, tape drive, Jaz drive, Zip drive, LS-100 drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to the system bus 1218, a removable or non-removable interface is typically used, such as interface 1226.

It is to be appreciated that FIG. 12 describes software that acts as an intermediary between users and the basic computer resources described in the suitable operating environment 1200. Such software includes an operating system 1228. Operating system 1228, which can be stored on disk storage 1224, acts to control and allocate resources of the computer system 1212. System applications 1230 take advantage of the management of resources by operating system 1228 through program modules 1232 and program data 1234 stored either in system memory 1216 or on disk storage 1224. It is to be appreciated that the disclosed subject matter can be implemented with various operating systems or combinations of operating systems.

A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236.

Thus, for example, a USB port may be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to computer 1212.

For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refer(s) to the hardware/software employed to connect the network interface 1248 to the bus 1218. While communication connection 1250 is shown for illustrative clarity inside computer 1212, it can also be external to computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

FIG. 13 is a schematic block diagram of a sample-computing environment 1300 with which the subject innovation can interact. The system 1300 includes one or more client(s) 1310. The client(s) 1310 can be hardware and/or software (e.g., threads, processes, computing devices). The system 1300 also includes one or more server(s) 1320. Thus, system 1300 can correspond to a two-tier client server model or a multi-tier model (e.g., client, middle tier server, data server), amongst other models. The server(s) 1320 can also be hardware and/or software (e.g., threads, processes, computing devices). The servers 1320 can house threads to perform transformations by employing the subject innovation, for example. One possible communication between a client 1310 and a server 1320 may be in the form of a data packet transmitted between two or more computer processes.

The system 1300 includes a communication framework 1330 that can be employed to facilitate communications between the client(s) 1310 and the server(s) 1320. The client(s) 1310 are operatively connected to one or more client data store(s) 1340 that can be employed to store information local to the client(s) 1310. Similarly, the server(s) 1320 are operatively connected to one or more server data store(s) 1350 that can be employed to store information local to the servers 1320.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art should recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
    a program component configured to program one or more non-volatile memory (NVM) cells of an array of pairs of NVM cells using Fowler-Nordhiem (FN) tunneling;
    an erase component configured to erase the one or more NVM cells of the array of pairs of NVM cells using FN tunneling; and
    a read component configured to read the one or more NVM cells of the array of pairs of NVM cells, wherein the program component is configured to:
    apply one or more prohibitive electric fields to prevent charge from being stored in one or more NVM cells of the array of pairs of NVM cells;
    apply one or more FN electric fields to cause charge to be stored in one or more other NVM cells of the array of pairs of NVM cells;
    remove the one or more FN electric fields; and
    remove the one or more prohibitive electric fields.

2. The system of claim 1, wherein the program component is configured to apply the one or more prohibitive electric fields between a first/second word line and a first/second bit line of the array of pairs of NVM cells.

3. The system of claim 2, wherein the program component is configured to apply the one or more FN electric fields between the second/first word line and the second/first bit line of the array of pairs of NVM cells.

4. The system of claim 3, wherein the program component is configured to remove the one or more FN electric fields between the second/first word line and the second/first bit line of the array of pairs of NVM cells.

5. The system of claim 4, wherein the program component is configured to remove the one or more prohibitive electric fields between the first/second word line and the first/second bit line of the array of pairs of NVM cells.

6. The system of claim 1, wherein the erase component is configured to:
    apply one or more prohibitive electric fields to prevent charge from being removed from one or more NVM cells of the array of pairs of NVM cells;
    apply one or more FN electric fields to cause charge to be removed from one or more other NVM cells of the array of pairs of NVM cells;
    remove the one or more FN electric fields; and
    remove the one or more prohibitive electric fields.

7. The system of claim 1, wherein the read component is configured to:
    apply one or more first electric fields to one or more NVM cells of the array of pairs of NVM cells;
    apply one or more second electric fields to one or more other NVM cells of the array of pairs of NVM cells to cause the one or more other NVM cells to exhibit select transistor behavior;
    sense whether the one or more NVM cells is conductive;
    remove the one or more second electric fields; and
    remove the one or more first electric fields.

8. A system comprising:
    a program component configured to program one or more non-volatile memory (NVM) cells of an array of pairs of NVM cells using Fowler-Nordhiem (FN) tunneling;
    an erase component configured to erase the one or more NVM cells of the array of pairs of NVM cells using FN tunneling; and
    a read component configured to read the one or more NVM cells of the array of pairs of NVM cells, wherein the erase component is configured to:
    apply one or more prohibitive electric fields to prevent charge from being removed from one or more NVM cells of the array of pairs of NVM cells;
    apply one or more FN electric fields to cause charge to be removed from one or more other NVM cells of the array of pairs of NVM cells;
    remove the one or more FN electric fields; and
    remove the one or more prohibitive electric fields.

9. The system of claim 8, wherein the erase component is configured to apply the one or more prohibitive electric fields between one or more word and bit lines and a substrate of the array of pairs of NVM cells.

10. The system of claim 9, wherein the erase component is configured to apply the one or more FN electric fields between the substrate of the array of pairs of NVM cells and one or more other word and bit lines of the array of pairs of NVM cells.

11. The system of claim 10, wherein the erase component is configured to remove the one or more FN electric fields between the substrate of the array of pairs of NVM cells and the one or more other word and bit lines of the array of pairs of NVM cells.

12. The system of claim 11, wherein the erase component is configured to remove the one or more prohibitive electric fields between the one or more word and bit lines and the substrate of the array of pairs of NVM cells.

13. The system of claim 8, wherein the read component is configured to:
apply one or more first electric fields to one or more NVM cells of the array of pairs of NVM cells;
apply one or more second electric fields to one or more other NVM cells of the array of pairs of NVM cells to cause the one or more other NVM cells to exhibit select transistor behavior;
sense whether the one or more NVM cells is conductive;
remove the one or more second electric fields; and
remove the one or more first electric fields.

14. A system comprising:
a program component configured to program one or more non-volatile memory (NVM) cells of an array of pairs of NVM cells using Fowler-Nordhiem (FN) tunneling;
an erase component configured to erase the one or more NVM cells of the array of pairs of NVM cells using FN tunneling; and
a read component configured to read the one or more NVM cells of the array of pairs of NVM cells, wherein the read component is configured to:

apply one or more first electric fields to one or more NVM cells of the array of pairs of NVM cells;
apply one or more second electric fields to one or more other NVM cells of the array of pairs of NVM cells to cause the one or more other NVM cells to exhibit select transistor behavior;
sense whether the one or more NVM cells is conductive;
remove the one or more second electric fields; and
remove the one or more first electric fields.

15. The system of claim 14, wherein the read component is configured to apply the one or more first electric fields between a first/second word line and a first/second bit line of the array, of pairs of NVM memory cells.

16. The system of claim 15, wherein the read component is configured to apply the one or more second electric fields between the second/first word line and the second/first bit line of the array of pairs of NVM memory cells.

17. The system of claim 16, wherein the read component is configured to sense whether the one or more memory cells is conductive by measuring current or voltage on at least one bit line of the array of pairs of NVM cells.

18. The system of claim 17, wherein the read component is configured to:
apply one or more prohibitive electric fields to create an isolation region that prevents charge transfer between other regions.

19. The system of claim 18, wherein the read component is configured to apply the one or more prohibitive electric fields between bit lines of the array of pairs of NVM cells.

20. The system of claim 14, wherein the program component is configured to:
apply one or more prohibitive electric fields to prevent charge from being stored in one or more NVM cells of the array of pairs of NVM cells;
apply one or more FN electric fields to cause charge to be stored in one or more other NVM cells of the array of pairs of NVM cells;
remove the one or more FN electric fields; and
remove the one or more prohibitive electric fields.

* * * * *